United States Patent
Holt et al.

(10) Patent No.: US 9,391,721 B2
(45) Date of Patent: Jul. 12, 2016

(54) PASSIVE INTERMODULATION TESTING USING PULSE STIMULUS

(71) Applicant: Bird Technologies Group Inc., Solon, OH (US)

(72) Inventors: Timothy L. Holt, Chardon, OH (US); Timothy M. O'Brien, Stow, OH (US)

(73) Assignee: BIRD TECHNOLOGIES GROUP INC., Solon, OH (US)

( * ) Notice: Subject to any disclaimer, the term of this patent is extended or adjusted under 35 U.S.C. 154(b) by 0 days.

(21) Appl. No.: 14/775,629

(22) PCT Filed: Mar. 17, 2014

(86) PCT No.: PCT/US2014/000344
§ 371 (c)(1),
(2) Date: Sep. 11, 2015

(87) PCT Pub. No.: WO2014/145553
PCT Pub. Date: Sep. 18, 2014

(65) Prior Publication Data
US 2016/0028497 A1    Jan. 28, 2016

Related U.S. Application Data

(60) Provisional application No. 61/793,644, filed on Mar. 15, 2013.

(51) Int. Cl.
*H04B 3/46* (2015.01)
*H04B 17/26* (2015.01)

(52) U.S. Cl.
CPC .................................. *H04B 17/26* (2015.01)

(58) Field of Classification Search
CPC ... H04B 17/0065; H04L 17/0042; H01Q 1/52
USPC .................. 375/228, 130, 146, 346; 324/520
See application file for complete search history.

(56) References Cited

U.S. PATENT DOCUMENTS

| 3,976,940 | A | 8/1976 | Chau et al. |
| 6,144,692 | A | 11/2000 | Beck |
| 8,054,088 | B2 | 11/2011 | Delforce |
| 8,058,880 | B2 | 11/2011 | Bradley |

(Continued)

FOREIGN PATENT DOCUMENTS

| WO | 2012/009757 A1 | 1/2012 |
| WO | 2012/126056 A1 | 9/2012 |

OTHER PUBLICATIONS

International Search Report and Written Opinion mailed Jul. 17, 2014 for corresponding application No. PCT/US2014/030344.

(Continued)

*Primary Examiner* — Khai Tran
(74) *Attorney, Agent, or Firm* — Wegman, Hessler & Vanderburg

(57) ABSTRACT

Disclosed is a passive intermodulation (PIM) test system having a pulsed signal generator configured to generate and apply a pulsed stimulus signal to a device under test. The PIM test system is further configured to measure a power of at least one PIM product generated by a PIM source in the device under test using the pulsed stimulus signal. Also disclosed in a method for Cevaluating PIM in a device under test, the method includes using a pulsed stimulus signal to measure a power of at least one PIM product generated by a PIM source in the device under test.

20 Claims, 10 Drawing Sheets

(56) References Cited

U.S. PATENT DOCUMENTS

| | | | |
|---|---|---|---|
| 8,194,715 B2* | 6/2012 | Krishnan | H03K 4/92 327/100 |
| 8,294,469 B2 | 10/2012 | Bradley | |
| 8,760,148 B1 | 6/2014 | Bradley | |
| 2002/0094785 A1 | 7/2002 | Deats | |
| 2003/0040277 A1 | 2/2003 | Deats | |
| 2009/0125253 A1 | 5/2009 | Blair et al. | |
| 2010/0164504 A1 | 7/2010 | Bradley | |
| 2013/0182753 A1* | 7/2013 | Delforce | H04B 17/0085 375/228 |

OTHER PUBLICATIONS

Anritsu—PIM Master Passive Intermodulation Analyzer MW82119A User Guide—Published Dec. 2012.
Anritsu—PIM Master Passive Intermodulation Analyzer MW82119A Maintenance Manual—Published Feb. 2013.
Anritsu—PIM Master Quick Fact Sheet—Dated Nov. 2012.
Anritsu—PIM Master MW82119A Product Brochure—Dated Dec. 2012.
U.S. Appl. No. 60/233,346, filed Sep. 18, 2000.
Boonton—PIM 21 Portable Passive Intermodulation Test Set Data Sheet—Dated 2010.

* cited by examiner

PASSIVE INTERMODULATION TESTING USING PULSE STIMULUS

CROSS-REFERENCE TO RELATED APPLICATIONS

This application is the U.S. National phase entry of International Patent Application No. PCT/US2014/030344, filed Mar. 17, 2014, which claims priority to U.S. Provisional Patent Application Ser. No. 61/793,644, filed Mar. 15, 2013, all of the above listed applications are incorporated by reference herein.

FIELD OF THE INVENTION

This application is directed to passive intermodulation testing. More specifically, to passive intermodulation testing using pulse stimulus.

BACKGROUND OF THE INVENTION

Passive Intermodulation (PIM) testing has become an important component in the evaluation and troubleshooting of modern communications systems. The increased popularity of this testing may be attributed to several factors, including the density of services occupying available communications spectrum, as well as the general decrease of base station and user equipment power levels. Decreased power levels necessarily result in a decreased signal-to-noise ratio within the communications system, which makes PIM products more problematic to system performance. This increases the need for PIM testing.

BRIEF SUMMARY OF THE INVENTION

According to one aspect of the invention, a pulsed tone passive intermodulation (PIM) test system comprises: a DC power source configured to provide power to the pulsed tone PIM test system; a pulse generator electrically coupled to a first transmitter and a second transmitter, the pulse generator and the first transmitter configured for generating a first pulsed stimulus signal, the pulse generator and the second transmitter configured for generating a second pulsed stimulus signal; a first bandpass filter electrically coupled to the first transmitter configured to attenuate spectral components associated with the first pulsed stimulus signal; a second bandpass filter electrically coupled to the second transmitter configured to attenuate spectral components associated with the second pulsed stimulus signal; a combiner electrically coupled to the first and second bandpass filter, the combiner configured to combine the first and second stimulus signals into a combined pulsed stimulus signal; a directional coupler having a main line with an input electrically coupled to the combiner and an output configured to be electrically coupled to a device under test, the main line is configured to deliver the combined pulsed stimulus signal propagating in the forward direction to the device under test and receive a signal propagating in the reflected direction from the device under test; the bi-direction coupler is further comprised of a reflected channel output; the directional coupler is further configured to sample the signal propagating in the reflected direction on the main line; the reflected channel output is configured to provide the sample signal propagating in the reflected direction to a notch filter; the notch filter is electrically coupled to the reflected channel output and configured to attenuate the first and second pulsed stimulus signals from the sample signal propagating in the reflected direction; a low noise gain stage electrically coupled to the notch filter, the low noise gain stage configured to amplify the sample signal propagating in the reflected direction; and a spectrum analyzer electrically coupled to the low noise gain stage configured to receive and identify at least one PIM product generated by a PIM source in the device under test.

In another aspect of the invention, the pulsed tone PIM test system is further comprised of a processor electrically coupled to the pulse generator, first pulsed power amplifier, second pulsed power amplifier, and the spectrum analyzer, the processor configured to generate and apply the first and second stimulus pulses to the device under test at time T1 and measure a power of the at least one PIM products received by the spectrum analyzer at time $T2_{A-N}$.

In another aspect of the invention, the processor is configured to calculate a power ratio for the at least one PIM product.

In another aspect of the invention, the power ratio is dBc.

In another aspect of the invention, the processor is further configured to calculate a distance between the pulsed tone PIM test system and the PIM source in the device under test using an elapsed time between T1 and $T2_{A-N}$ the at least one PIM product and a velocity factor value of the device under test.

In another aspect of the invention, the pulsed tone PIM test system further comprises a keypad electrically coupled to the processor, the keypad configured for user to enter the velocity factor value or select a transmission medium for the device under test that corresponds to a velocity factor value stored in memory of the processor.

In another aspect of the invention, the pulsed tone PIM test system is further comprised of a display electrically coupled to the processor, the display configured to display at least one PIM product statistic for the at least one PIM product.

In another aspect of the invention, the at least one PIM product statistic is at least one of PIM product power level, PIM product power ratio, or PIM product source distance.

In another aspect of the invention, the DC power source is comprised of a battery.

In another aspect of the invention, the DC power source is further comprised of circuitry configured to recharge the battery.

According to yet another aspect of the invention, a pulsed tone passive intermodulation (PIM) test system comprises: a DC power source configured to provide power to the pulsed tone PIM test system; a pulsed signal generator electrically coupled to a directional coupler, the pulsed signal generator configured to generating a combined pulsed stimulus signal; a directional coupler having a main line with an input electrically coupled to the combiner and an output configured to be electrically coupled to a device under test, the main line is configured to deliver the combined pulsed stimulus signal propagating in the forward direction to the device under test and receive a signal propagating in the reflected direction from the device under test; the bi-direction coupler is further comprised of a reflected channel output; the directional coupler is further configured to sample the signal propagating in the reflected direction on the main line; the reflected channel output is configured to provide the sample signal propagating in the reflected direction to a PIM analyzer; the PIM analyzer electrically coupled to the directional coupler; the PIM analyzer configured to receive and identify at least one PIM product generated by a PIM source in the device under test.

In another aspect of the invention, the pulsed tone PIM test system is further comprised of a processor electrically coupled to the pulsed signal generator, and the PIM analyzer, the processor configured to generate and apply the combined pulsed stimulus signal to the device under test at time T1 and measure a power of the at least one PIM product received by the PIM analyzer at time $T2_{A-N}$.

In another aspect of the invention, the combined pulsed stimulus signal is comprised of a first pulsed stimulus signal and a second pulsed stimulus signal.

In another aspect of the invention, the processor is configured to calculate a power ratio for each of the at least one PIM products.

In another aspect of the invention, the power ratio is dBc.

In another aspect of the invention, the processor is further configured to calculate a distance between the pulsed tone PIM test system and the PIM source in the device under test using an elapsed time between T1 and $T2_{A-N}$ the at least one PIM product and a velocity factor value of the device under test.

In another aspect of the invention, the pulsed tone PIM test system is further comprised of a user I/O electrically coupled to the processor, the user I/O configured for user to enter the velocity factor value or select a transmission medium for the device under test that corresponds to a velocity factor value stored in memory of the processor.

In another aspect of the invention, the user I/O is further configured to display at least one PIM product statistic for the at least one PIM product.

In another aspect of the invention, the at least one PIM product statistic is at least one of PIM product power level, PIM product power ratio, or PIM product source distance.

In another aspect of the invention, the DC power source is comprised of a battery.

In another aspect of the invention, the DC power source is further comprised of circuitry configured to recharge the battery.

According to yet another aspect of the invention, a method for evaluating passive intermodulation (PIM) in a device under test, comprises the steps of: providing a pulsed tone PIM test system having a DC power source; generating a combined pulsed stimulus signal; applying the combined pulsed stimulus signal to the device under test; receiving at least one PIM product generated by a PIM source in the device under test; and measuring a power of the at least one PIM product generated by a PIM source in the device under test.

In another aspect of the invention, the combined pulsed stimulus signal is comprised of a first pulsed stimulus signal and a second pulsed stimulus signal.

In another aspect of the invention, the method further comprises calculating a power ratio for each of the at least one PIM product using the measured power of the at least one PIM product.

In another aspect of the invention, the power ratio is dBc.

In another aspect of the invention, the method further comprises calculating a distance between the pulsed tone PIM test system and the PIM source in the device under test using an elapsed time between T1 and $T2_{A-N}$ for the at least one PIM product and a velocity factor of the device under test; wherein the combined pulsed stimulus signal is applied by the PIM analyzer to the device under test at time T1 and the at least one PIM product is received by the PIM analyzer at time $T2_{A-N}$.

In another aspect of the invention, the velocity factor is provided by a user entering the velocity factor value into a user I/O of the pulsed tone PIM test system or using the user I/O to select the transmission medium for the device under test that corresponds to a velocity factor value stored in the memory of the pulsed tone PIM test system.

In another aspect of the invention, the user I/O is further configured to display at least one PIM product statistic for the at least one PIM product.

In another aspect of the invention, the at least one PIM product statistic is at least one of PIM product power level, PIM product power ratio, or PIM product source distance.

In another aspect of the invention, the DC power source is comprised of a battery.

In another aspect of the invention, the DC power source is further comprised of circuitry configured to recharge the battery.

According to yet another aspect of the invention, a passive intermodulation (PIM) test system is comprised of a pulsed signal generator; said PIM test system is configured to measure a power of said at least one PIM product generated by a PIM source in said device under test using a pulsed stimulus signal.

In another aspect of the invention, said PIM test system is further configured to calculate a power ratio for said at least one PIM product.

In another aspect of the invention, the PIM test system is further configured to calculate a distance between said PIM test system and said PIM product source in said device under test.

In another aspect of the invention, the PIM test system is further configured to display at least one PIM product statistic for said at least one PIM product.

In another aspect of the invention, the at least one PIM product statistic is at least one of PIM product power level, PIM product power ratio, or PIM product source distance.

According to yet another aspect of the invention, a method for determining passive intermodulation (PIM) in a device under test is comprised of: using a pulsed stimulus signal to measure a power of at least one PIM product generated by a PIM source in said device under test.

In another aspect of the invention, the pulsed stimulus signal is a combined pulsed stimulus signal comprised of a first pulsed stimulus signal and a second pulsed stimulus signal.

In another aspect of the invention, the method further comprises calculating a power ratio for said at least one PIM product using said measured power of said at least one PIM product.

In another aspect of the invention, the power ratio is dBc.

In another aspect of the invention, the method further comprises calculating a distance between said PIM test system and said PIM source in said device under test.

Advantages of the present invention will become more apparent to those skilled in the art from the following description of the embodiments of the invention which have been shown and described by way of illustration. As will be realized, the invention is capable of other and different embodiments, and its details are capable of modification in various respects.

BRIEF DESCRIPTION OF SEVERAL VIEWS OF THE DRAWINGS

These and other features of the present invention, and their advantages, are illustrated specifically in embodiments of the invention now to be described, by way of example, with reference to the accompanying diagrammatic drawings, in which.

Figure 1:
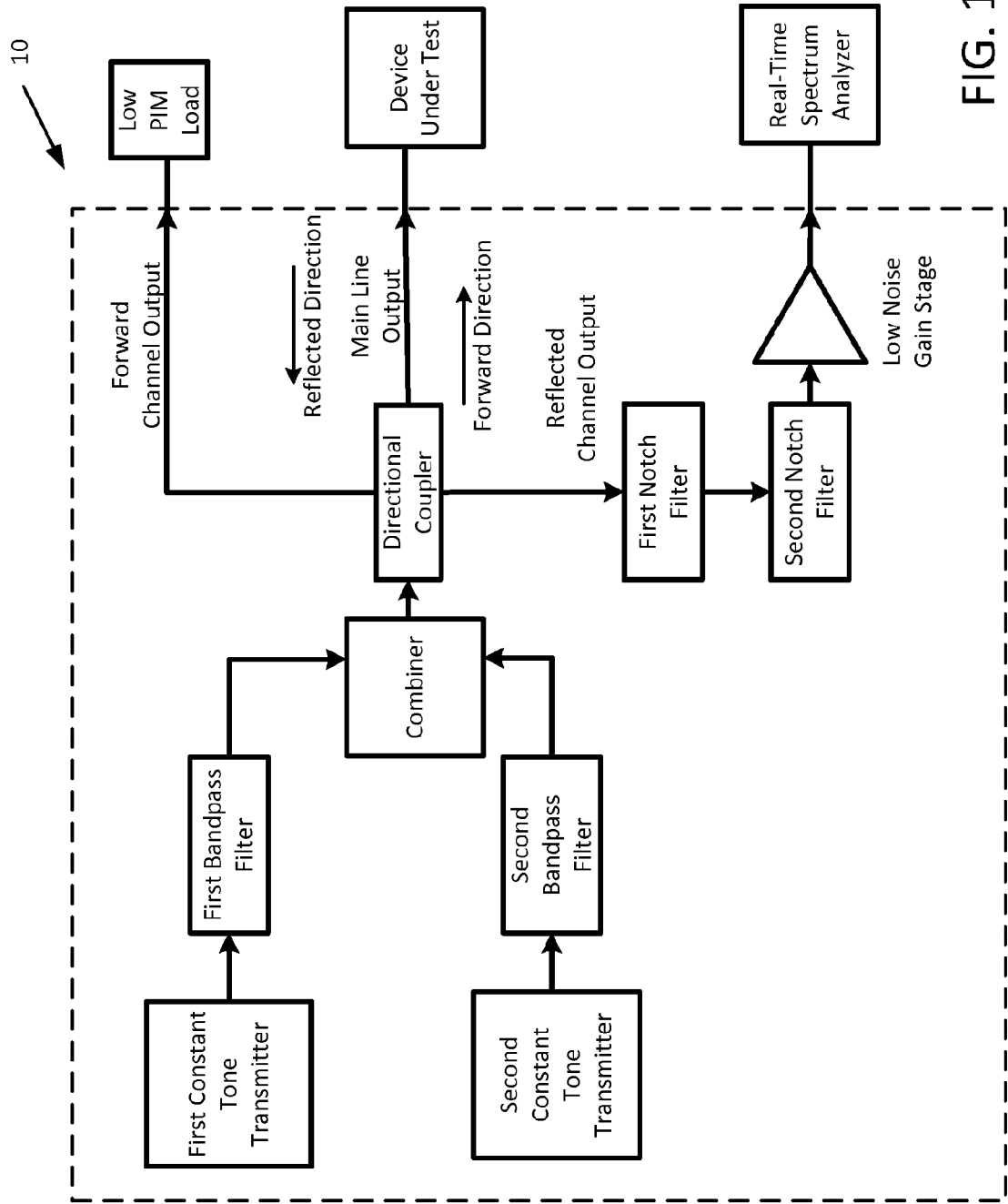
FIG. 1 is a block diagram of a traditional PIM test system.

It should be noted that all the drawings are diagrammatic and not drawn to scale. Relative dimensions and proportions of parts of these figures have been shown exaggerated or reduced in size for the sake of clarity and convenience in the drawings. The same reference numbers are generally used to refer to corresponding or similar features in the different embodiments. Accordingly, the drawing(s) and description are to be regarded as illustrative in nature and not as restrictive.

DETAILED DESCRIPTION OF THE PREFERRED EMBODIMENT

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In at least some instances, the approximating language may correspond to the precision of an instrument for measuring the value. Range limitations may be combined and/or interchanged, and such ranges are identified and include all the sub-ranges stated herein unless context or language indicates otherwise. Other than in the operating examples or where otherwise indicated, all numbers or expressions referring to quantities of ingredients, reaction conditions and the like, used in the specification and the claims, are to be understood as modified in all instances by the term "about".

"Optional" or "optionally" means that the subsequently described event or circumstance may or may not occur, or that the subsequently identified material may or may not be present, and that the description includes instances where the event or circumstance occurs or where the material is present, and instances where the event or circumstance does not occur or the material is not present.

As used herein, the terms "comprises", "comprising", "includes", "including", "has", "having", or any other variation thereof, are intended to cover a non-exclusive inclusion. For example, a process, method, article or apparatus that comprises a list of elements is not necessarily limited to only those elements, but may include other elements not expressly listed or inherent to such process, method, article, or apparatus.

The singular forms "a", "an", and "the" include plural referents unless the context clearly dictates otherwise.

Aspects of the disclosed technology recognize that traditional PIM testing uses stimulus signals that are typically relatively high (e.g., 20 Watts) continuous wave tones, which result in test systems weighing in excess of 60 pounds. Accordingly, a need exists for a lighter PIM test system.

FIG. 1 shows the arrangement of a typical constant tone PIM test system 10. PIM products are generated whenever two or more signals present within a communications system are exposed to a non-linear component within the system. Non-linear system components may be found in many places such as, but not limited to, solid-state junctions on non-linear junctions located within the system. Solid state junctions are commonly found in such places as the output stages of power amplifiers. Non-linear junctions formed by the contact of dissimilar metals and the formation of oxide layers between the dissimilar metals.

Exposing the two or more signals to non-linear elements within the system results in the generation of mixing components of the signals. These mixing components are the sum and difference (cross products) of the signals. Often, these mixing components occur at frequencies that are within the usable frequency range of the system, and result in the impairment of communications at the frequencies of the mixing components.

The process that is used for the testing of systems and components for the presence of PIM products involves stimulating the device under test using two signals that are chosen such that their mixing products will occur within the communications band of interest.

The overall noise performance of a PIM text system is largely dependent upon the system bandwidth (Noise Power =KTB, where K is Boltzmann's Constant of 1.38 E-23 Joules/Kelvin, T is the absolute temperature in degrees Kelvin, and B is the Bandwidth in Hertz). In general, the signal measurements that are made are limited by the filters to the minimum bandwidth necessary in order to pass the stimulus signal, or the passive intermodulation products. Therefore, in order to enhance the usable dynamic range of the measurement system, the stimulus signals are typically relatively high power (e.g., 20 Watts) continuous wave tones. Stimulus signals at this level require the use of amplifiers that are quite large and heavy, resulting in Passive Intermodulation test systems weighing in excess of sixty pounds and requiring an AC power source. Accordingly, the constant tone PIM test systems 10 are cumbersome and inconvenient for PIM field testing application, such as during final integration and testing of an RF communications base station.

Figure 2:
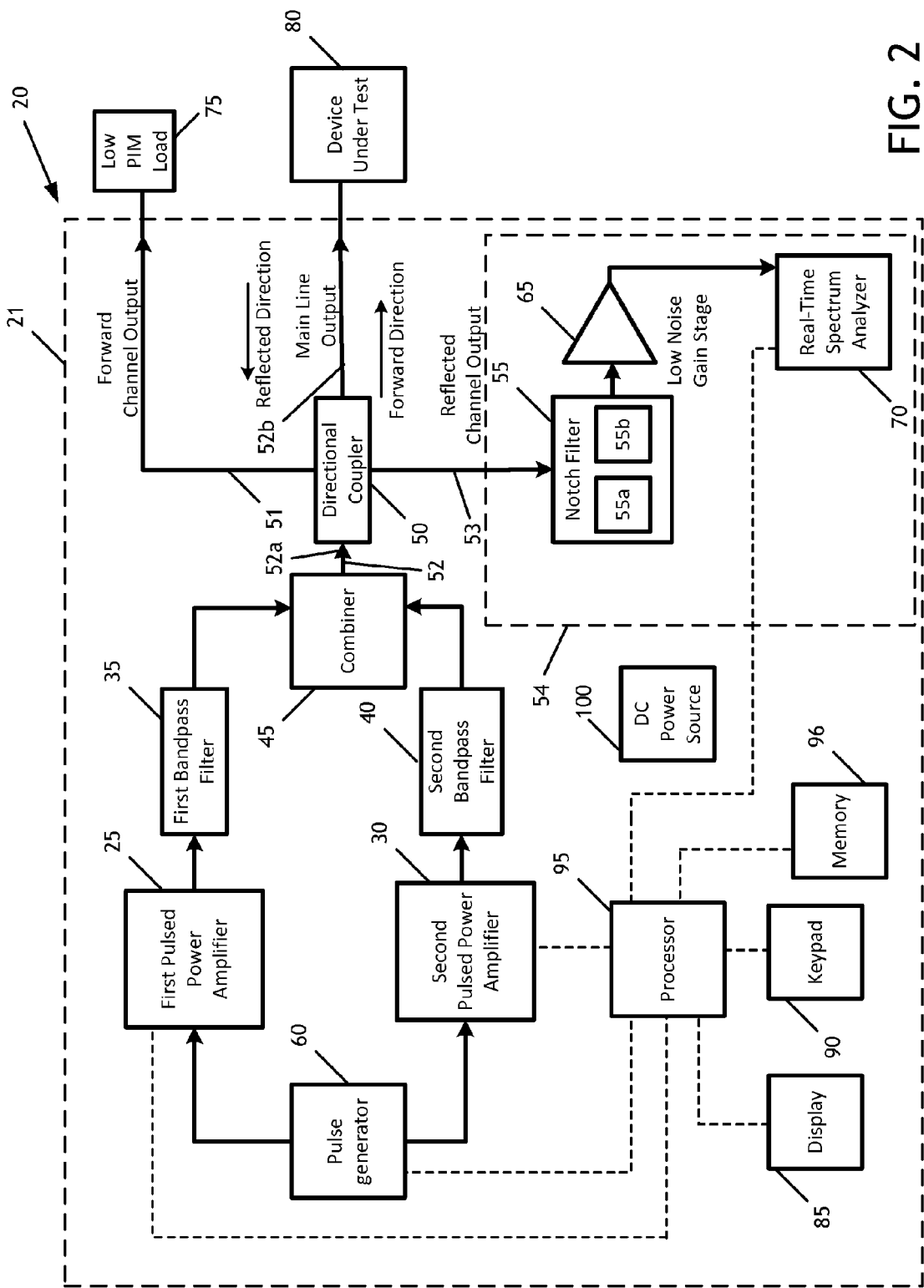
FIG. 2 is a block diagram of a PIM test system that employs pulse stimulus in accordance with an embodiment of the invention.

FIG. 2 shows an embodiment of a pulsed tone PIM test system 20, which is battery powered, smaller, lighter, and more practical for use during final integration and testing of an RF communications base station.

Pulsed tone PIM system 20 is comprised of a first pulsed power amplifier 25 and a second pulsed power amplifier 30, which are optimized for the generation of pulse type waveforms and pulsed by pulse generator 60. First pulsed power amplifier 25 generates a first pulsed stimulus signal, which is routed to first bandpass filter 35. Second pulsed power amplifier 30 generates a second pulsed stimulus signal, which is routed to second bandpass filter 40. First bandpass filter 35 and second bandpass filter 40 minimize any spectral components associated with the first and second pulsed stimulus signals. The bandpass filtered first and second stimulus signals are passed from first bandpass filter 35 and second bandpass filter 40 to combiner 45. Combiner 45 combines the bandpass filtered first and second pulsed stimulus signals and provides the combined pulsed stimulus signal to the main line input 52a of directional coupler 50 (or other suitable coupler). Directional coupler 50 has a main line 52 and is configured to sample the signal propagating in the forward and reflected directions on main line 52. The sample of the signal propagating in the forward direction on main line 52 is provided to forward channel output 51 and the sample of the signal propagating in the reflected direction on main line 52 is provided to reflected channel output 53.

Forward channel output 51 provides a sample of the signal propagating in the forward direction on main line 52 and is terminated with low PIM load 75. Low PIM load 75 does not introduce any measureable intermodulation products that may interfere with the PIM measurement. In some embodiments, forward channel output 51 is configured to accept a removable or interchangeable low PIM load 75 that is external to the housing 21 of pulsed tone PIM test system 20.

Main line output 52b of main line 52 is configured to connect to device under test 80, pass the combined stimulus signal to device under test 80 in the forward direction, and receive a signal propagating in the reflected direction from device under test 80 containing PIM products.

Reflected channel output 53 provides a sample of the signal on main line 52 propagating in the reflected direction, the reflected signal, to a receiver 54 including suitable receiving and processing circuitry. In the embodiment illustrated in FIG. 2, the receiver includes a notch filter 55. The reflected signal provided to notch filter 55 is comprised of the first pulsed stimulus signal, second pulsed stimulus signal, and any PIM products generated by device under test 80.

Notch filter 55 attenuates the first and second pulsed stimulus signals from the reflected channel output. In some embodiments, notch filter 55 is comprised of a first notch filter 55a configured to filter the first pulsed stimulus signal from the reflected channel output, and a second notch filter 55b configured to filter the second pulsed stimulus signal from the reflected channel output. In embodiments having a first and second notch filter 55b, the first notch filter 55a is electrically coupled to directional coupler 50 through reflected channel output 53, first notch filter 55a is electrically coupled to second notch filter 55b, and second notch filter 55b is electrically coupled to low noise gain stage 65.

After filtering the first and second pulsed stimulus signals, the reflected signal is amplified by low noise gain stage 65 and provided to spectrum analyzer 70, which identifies and displays any PIM components generated by device under test 80 via display 85.

As can be seen, pulsed tone PIM test system is further comprised of processor 95 having memory 96. Processor 95 receives user input from keypad 90 mounted to housing 21 and provides information to the user via display 85 also mounted to housing 21. It is contemplated that in some embodiments, display 85 and keypad 90 can be combined into a single unit mounted to housing 21, such as a touch screen.

Processor 95 communicates with and controls spectrum analyzer 70, pulse generator 60, first pulsed power amplifier 25 and second pulsed power amplifier 30. Accordingly, processor 95 is configured to generate first and second pulsed stimulus signals using pulse generator 60, first pulsed power amplifier 25, and second pulsed power amplifier 30, which are delivered to device under test 80.

Further, processor 95 is coupled to the receiver 54 and configured to determine when PIM products are generated by device under test 80, e.g., using spectrum analyzer 70 or other suitable receiving and analyzing circuitry. Further, in some embodiments, processor 95 is also configured to measure the elapsed time between the delivery of the first and second pulsed stimulus signals to device under test 80, and the reception of the PIM products at directional coupler 50.

Further, when a user provides processor 95 with the velocity factor of the transmission medium of device under test 80, processor 95 can calculate the distance from pulsed tone PIM test system 20 to the source of PIM components within device under test 80 using the elapsed time between the delivery of the first and second stimulus pulses to device under test 80 and the reception of the PIM products at directional coupler 50. It is contemplated that the user can provide the velocity factor of device under test 80 by directly inputting the velocity factor value using keypad 90 or selecting from a list of common transmission mediums shown on display 85 having corresponding velocity factors stored within memory 96.

DC power source 100 is configured to provide power to the components of pulsed tone PIM test system 20. Components of pulsed tone PIM test system 20 which draw power from and are electrically coupled to DC power source 100 may include, but are not limited to, first pulsed power amplifier 25, second pulsed power amplifier 30, pulse generator 60, low noise gain stage 65, spectrum analyzer 70, display 85, processor 95, and memory 96.

As can be seen in FIG. 2, pulse generator 60 is electrically coupled to first pulsed power amplifier 25 and second pulsed power amplifier 30. First pulsed power amplifier 25 and second pulsed power amplifier 30 produce high power pulsed signals ranging from as low as 0 Watts to about 40 Watts. First pulsed power amplifier 25 and second pulsed power amplifier 30 are AM modulated by pulse generator 60. First pulsed power amplifier 25 is electrically coupled to first bandpass filter 35, and second pulsed power amplifier 30 is electrically coupled to second bandpass filter 40. First bandpass filter 35 and second bandpass filter 40 are electrically coupled to combiner 45. Combiner 45 is electrically coupled to directional coupler 50.

Directional coupler 50 is electrically coupled to notch filter 55 through reflected channel output 53. Directional coupler 50 is configured to be electrically coupled to low PIM load 75 through forward channel output 51. Directional coupler 50 is configured to be electrically coupled to device under test 80 through output 52b of main line 52. Notch filter 55 is electrically coupled to low noise gain stage 65. Low noise gain stage 65 is electrically coupled to real time spectrum analyzer 70.

Processor 95 is electrically coupled to pulse generator 60, first pulsed power amplifier 25, second pulsed power amplifier 30, display 85, keypad 90, memory 96 and real time spectrum analyzer 70.

It will be appreciated that other configurations can be employed without departing from the scope of the present invention. For example, the PIM test system can be configured such that reflected channel output 53 provides a sample of the signal on main line 52 propagating in the reflected direction to a suitable receiver, which is coupled to the processor. The processor can be configured or otherwise programmed to carry out the analysis described in connection with the real-time spectrum analyzer 70.

Figure 3:
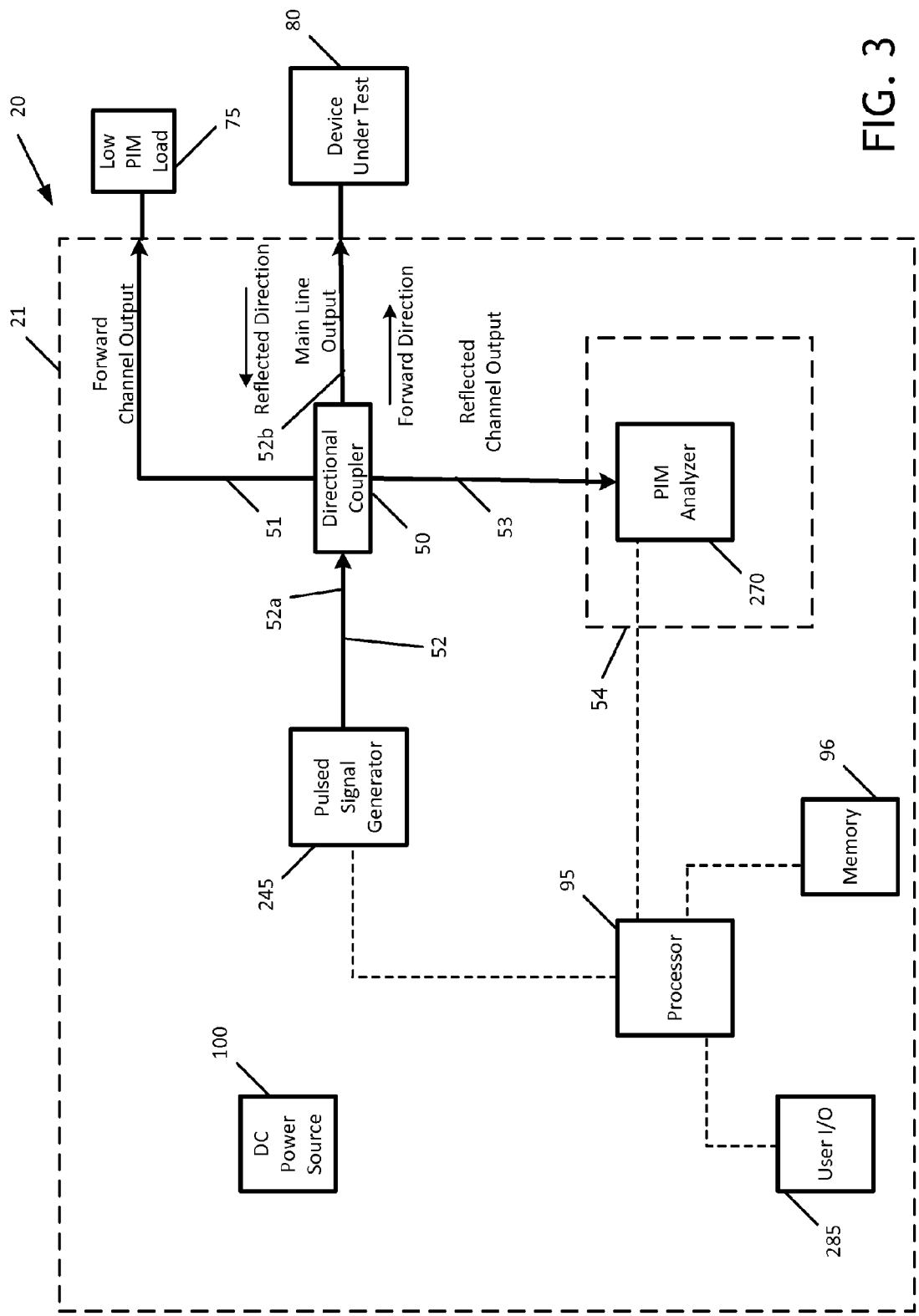
FIG. 3 is a block diagram of PIM test system that employs pulse stimulus in accordance with another embodiment of the invention.

FIG. 3 shows another embodiment of a pulsed tone PIM test system 20 having a pulsed signal generator 245 configured to generate a first pulsed stimulus signal and a second pulsed stimulus signal, minimize any spectral components associated with the first and second pulsed stimulus signals through filtering, and combine the bandpass filtered first and second pulsed stimulus signals into a combined pulsed stimulus signal.

Pulsed signal generator 245 is electrically coupled to directional coupler 50. Pulsed signal generator 245 is further configured to provide the combined pulsed stimulus signal to input 52a of main line 52 of directional coupler 50. Directional coupler 50 is electrically coupled to a receiver 54, e.g., a receiver including a PIM analyzer 270. Further, directional coupler 50 is configured to be electrically coupled to device under test 80 and low PIM load 75. Directional coupler 50 has a main line 52 and is configured to sample the signal propagating in the forward and reflected directions on main line 52. The sample of the signal propagating in the forward direction on main line 52 is provided to forward channel output 51 and the sample of the signal propagating in the reflected direction on main line 52 is provided to reflected channel output 53.

Forward channel output 51 provides a sample of the signal propagating in the forward direction on main line 52 and is terminated with low PIM load 75. Low PIM load 75 does not introduce any measureable intermodulation products that may interfere with the PIM measurement. In some embodiments, forward channel output 51 is configured to accept a removable or interchangeable low PIM load 75 that is external to the housing 21 of pulsed tone PIM test system 20.

Main line output 52b of main line 52 is configured to connect to device under test 80 and passes the combined stimulus signal to device under test 80 and receives a signal propagating in the reflected direction on main line 52 containing PIM products from device under test 80.

Reflected channel output 53 provides a sample of the signal on main line 52 propagating in the reflected direction, the reflected signal, to PIM analyzer 270, which identifies and displays any PIM products generated by device under test 80 via user I/O 285.

As can be seen, pulsed tone PIM test system 20 is further comprised of processor 95 having memory 96. Processor 95 receives user input from user I/O 285 mounted to housing 21 and also provides information to the user via user I/O 285. It is contemplated that in some embodiments user I/O 285 is a touch screen. Further, it is contemplated that in other embodiments user I/O 285 is a display 85 and keypad 90 mounted to housing 21.

Processor 95 is electrically coupled to pulsed signal generator 245, PIM analyzer 270, memory 96, and user I/O 285.

Processor 95 communicates with and controls PIM analyzer 270 and pulsed signal generator 245. Accordingly, processor 95 is configured to generate first and second stimulus pulses using pulsed signal generator 245, which are delivered to device under test 80.

Further, processor 95 is configured to determine when PIM products are generated by device under test 80 using PIM analyzer 270. Further, in some embodiments, processor 95 is also configured to measure the elapsed time between the delivery of the first and second stimulus pulses to device under test 80, and the reception of the PIM products at PIM analyzer 270. Further, when a user provides processor 95 with the velocity factor of the transmission medium of device under test 80, processor 95 can calculate the distance from pulsed tone PIM test system 20 to the source of PIM components within device under test 80 using the elapsed time between the delivery of the first and second stimulus pulses to device under test 80 and the reception of the PIM products at PIM analyzer 270. It is contemplated that the user can provide the velocity factor of device under test 80 by directly inputting the velocity factor value or selecting from a list of common transmission mediums shown on user I/O 285 having corresponding velocity factors stored within memory 96.

Further, processor 95 is configured to determine when PIM products are generated by device under test 80 using PIM analyzer 270. Further, in some embodiments, processor 95 is also configured to measure the elapsed time between the delivery of the first and second stimulus signals to device under test 80, and the reception of the PIM products at PIM analyzer 270.

Further, when a user provides processor 95 with the velocity factor of the transmission medium of device under test 80, processor 95 can calculate the distance from pulsed tone PIM test system 20 to the source of PIM components within device under test 80 using the elapsed time between the delivery of the first and second stimulus pulses to device under test 80 and the reception of the PIM products at PIM analyzer 270. It is contemplated that the user can provide the velocity factor of device under test 80 by directly inputting the velocity factor via user I/O 285 or selecting from a list of common transmission mediums via user I/O 285 having corresponding velocity factors stored within memory 96.

In one embodiment, pulsed signal generator 245 is comprised of a first pulsed power amplifier 25 and a second pulsed power amplifier 30 pulsed by pulse generator 60. Pulsed signal generator 245 is further comprised of first bandpass filter 35, second bandpass filter 40, and combiner 45. Pulse generator 60 is electrically coupled to first pulsed power amplifier 25 and second pulsed power amplifier 30. First pulsed power amplifier 25 is electrically coupled to first bandpass filter 35, and second pulsed power amplifier 30 is electrically coupled to second bandpass filter 40. First bandpass filter 35 and second bandpass filter 40 are electrically coupled to combiner 45. Combiner 45 is electrically coupled to directional coupler 50.

Additionally, in one embodiment, PIM analyzer 270 is comprised of notch filter 55, low noise gain stage 65, and spectrum analyzer 70. Directional coupler 50 is electrically coupled to notch filter 55 through reflected channel output 53. Directional coupler 50 is configured to be electrically coupled to low PIM load 75 through forward channel output 51. Directional coupler 50 is configured to be electrically coupled to device under test 80 through output 52b of main line 52. Notch filter 55 is electrically coupled to low noise gain stage 65. Low noise gain stage 65 is electrically coupled to real time spectrum analyzer 70.

Notch filter 55 is configured to attenuate the first and second pulsed stimulus signals from the reflected channel output 53. In some embodiments, notch filter 55 is comprised of a first notch filter 55a configured to filter the first pulsed stimulus signal from the reflected channel output, and a second notch filter 55b configured to filter the second pulsed stimulus signal from the reflected channel output. In embodiments having a first and second notch filter, the first notch filter 55a is electrically coupled to directional coupler 50 through reflected channel output 53, first notch filter 55a is electrically coupled to second notch filter 55b, and second notch filter 55b is electrically coupled to low noise gain stage 65.

DC power source 100 is configured to provide power to the components of pulsed tone PIM test system 20. Components of pulsed tone PIM test system 20 which draw power from and are electrically coupled to DC power source 100 may include, but are not limited to, pulsed signal generator 245, PIM analyzer 270, processor 95, user I/O 285, and memory 96.

It will be appreciated that other configurations can be employed without departing from the scope of the present invention. For example, the PIM test system can be configured such that reflected channel output 53 provides a sample of the signal on main line 52 propagating in the reflected direction to a suitable receiver, which is coupled to the processor. The processor can be configured or otherwise programmed to carry out the computation and analysis described in connection with the PIM analyzer 270.

Figure 2A:
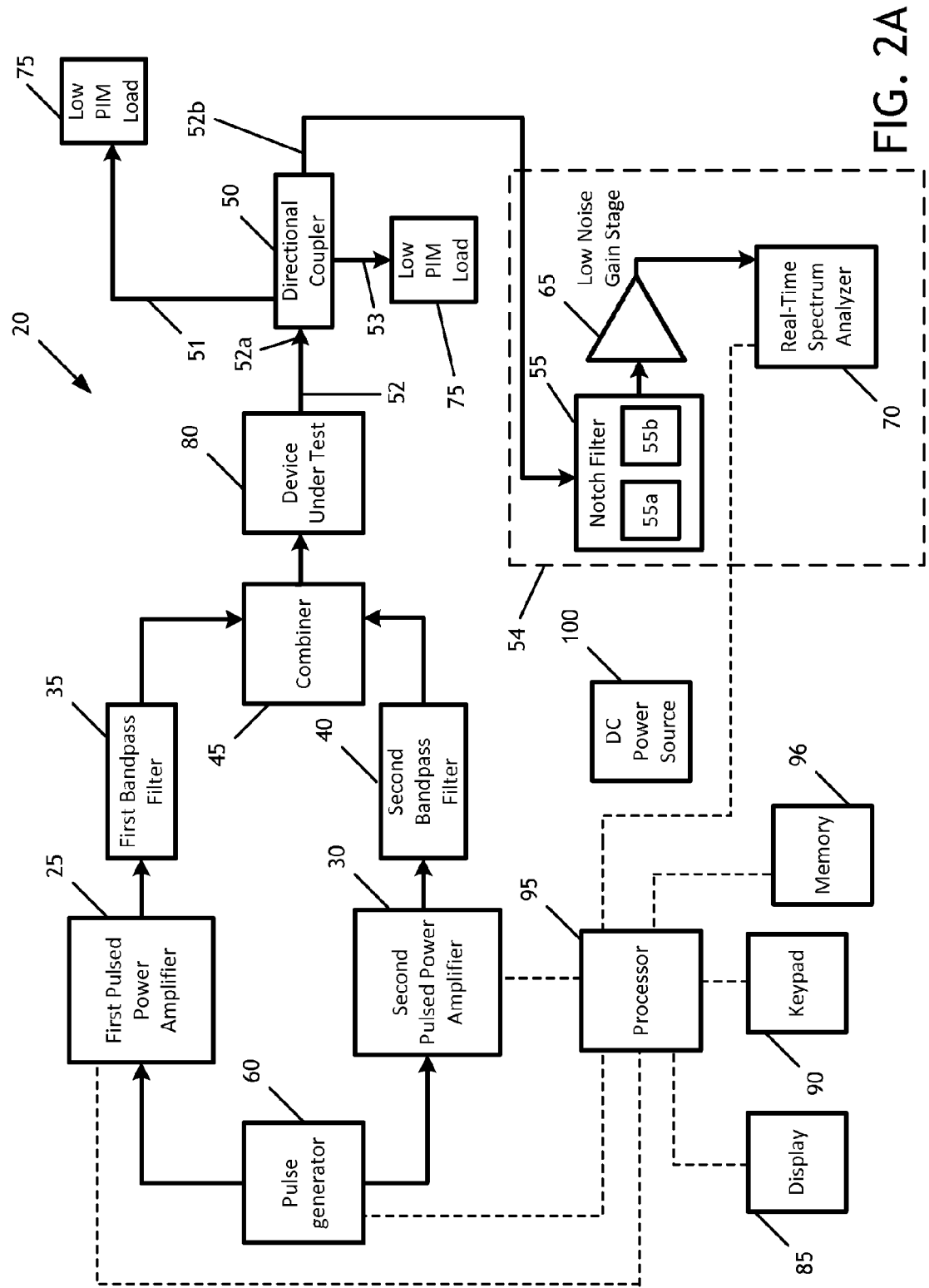
FIG. 2A is a block diagram of a PIM test system that employs pulse stimulus in accordance with another embodiment of the invention.
Figure 3A:
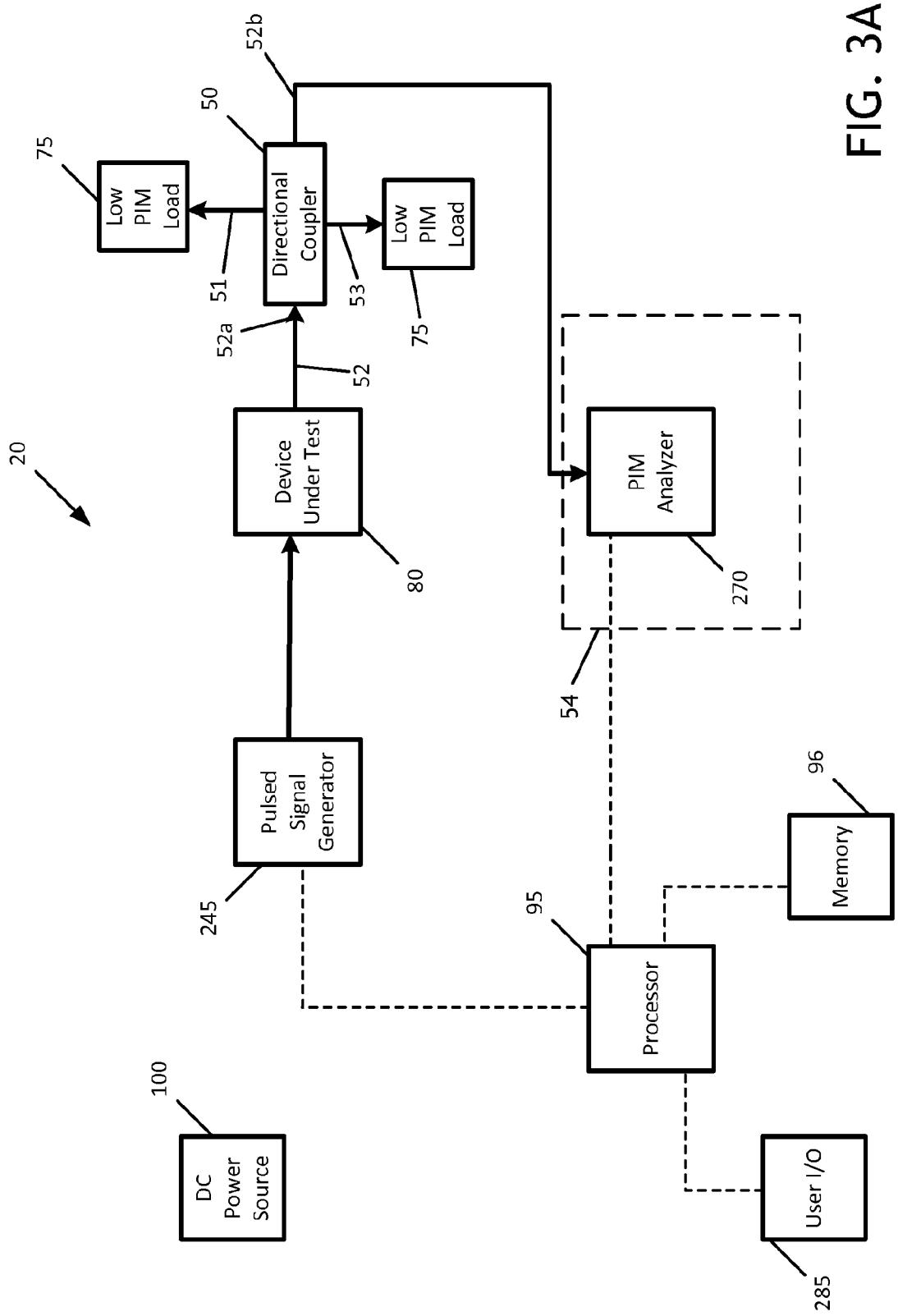
FIG. 3A is a block diagram of a PIM test system that employs pulse stimulus in accordance with another embodiment of the invention.

While the PIM system has been described above with respect to reflected PIM products, it will be appreciated that the PIM system can be configured to measure forward PIM products of a multi-port device (e.g., a two-port device such as a cable or filter) without departing from the scope of the present invention. FIG. 2A and FIG. 3A illustrate exemplary embodiments corresponding to FIG. 2 and FIG. 3, respectively. In these exemplary embodiments, the pulsed stimulus signals are provided directly to the device under test 80. The main line input 52a of the directional coupler is coupled to the second port of the device under test 80. The forward sample port or main line 52b of the directional coupler is connected to receiver 54 or other suitable processing circuitry to determine any forward PIM products associated with the device under test. In this exemplary configuration, the other two ports of the directional coupler 52 (e.g., forward port or forward channel output 51 and reflected coupled port or reflected channel output 53) are coupled to suitable low PIM loads 75.

Figure 4:
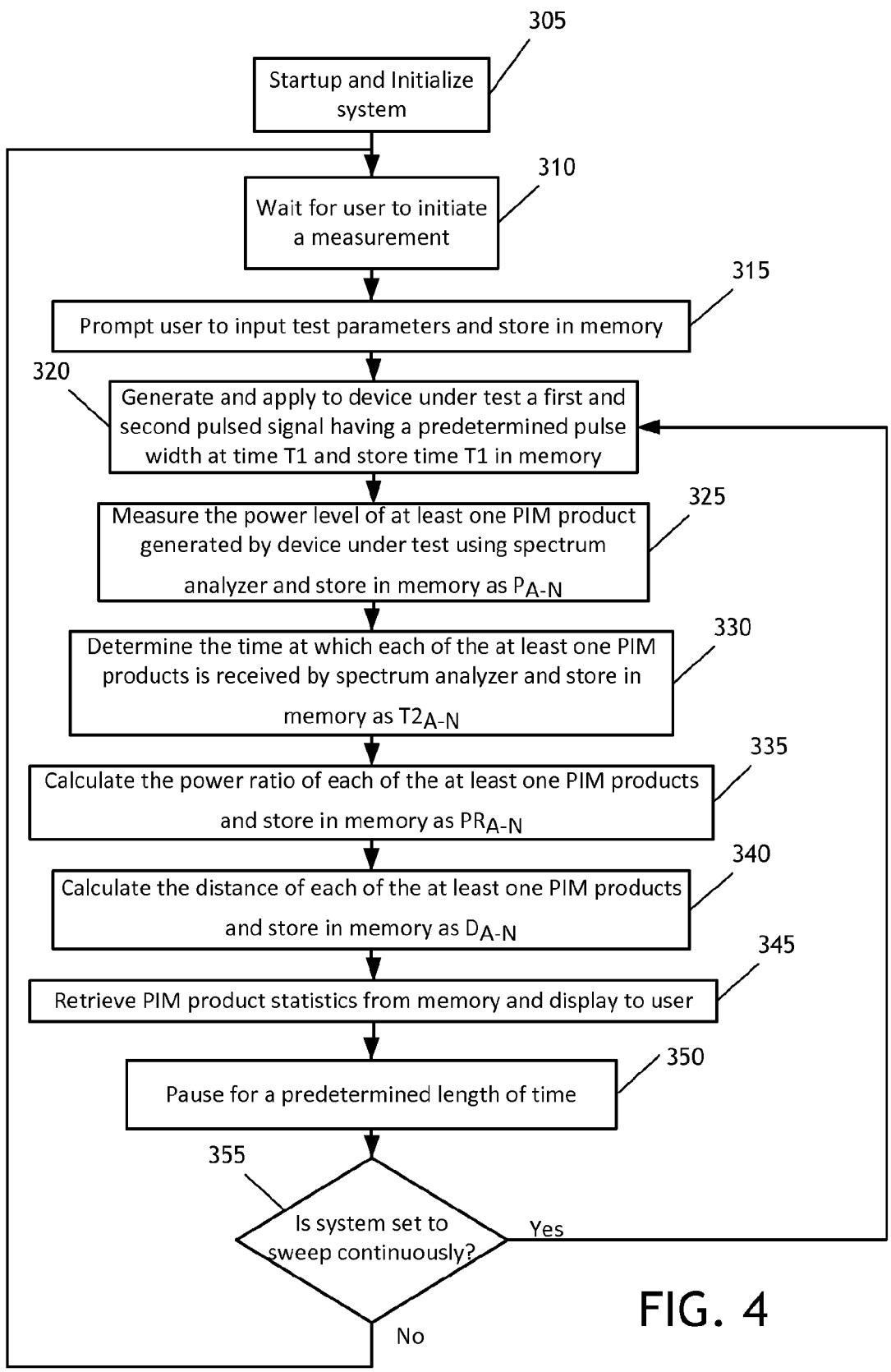
FIG. 4 is a flowchart of a program executed by the PIM test system processor that employs pulse stimulus in accordance with an embodiment of the invention.

FIG. 4 is a flowchart of the program stored in memory 96 and carried out by processor 95 in one embodiment of pulsed tone PIM test system 20. In step 305, pulsed tone PIM test system 20 is started and processor 95 is initialized. In step 310, the program waits for user to initiate a measurement before proceeding to step 315.

In step 315, the user is prompted to enter the testing parameters via keypad 90 and the testing parameters are stored in memory 96 upon entry. The testing parameters include one or more of the first pulsed signal frequency, the second pulsed signal frequency, the first pulsed signal power, the second pulsed signal power, the pulse width of the first and second pulsed signals, test type (e.g. sweep or non-sweep), sweep frequency range, and the velocity factor value of device under test 80.

In step 320, processor 95 uses first pulsed power amplifier 25, second pulsed power amplifier 30, and pulse generator 60 to generate and apply a first pulsed signal and a second pulsed signal, in accordance with the testing parameters to device under test 80. The first pulsed signal and second pulsed signal are combined before they are applied to device under test 80. Pulse generator 60 activate first pulsed power amplifier 25 and second pulsed power amplifier 30 for a predetermined length of time, thereby generating a first pulsed signal and second pulsed signal having pulse width equivalent to the predetermined length of time. In one embodiment, the pulse width is about several milliseconds. In another embodiment, the pulse width is between about 1 millisecond and about 1 second. In a further embodiment, the pulse width is about 10 milliseconds.

In step 325, processor 95 uses spectrum analyzer 70 to measure the power level of at least one PIM product generated by device under test 80 and stores the measured power level of the at least one PIM product in memory 96 as $P_{A-N}$, with N being the letter or letters of the alphabet representative of the number of PIM products measured by spectrum analyzer 70 in this step.

In step 330, processor 95 determines the time at which each of the at least one PIM products measured in step 325 was received by spectrum analyzer 70. The time or times are stored in memory as $T2_{A-N}$, with N being the letter or letters of the alphabet representative of the number of PIM products measured by spectrum analyzer 70 in step 325.

In step 335, processor 95 calculates the power ratio of each of the at least one PIM products measured in step 325 and stores the measured power ratios as $PR_{A-N}$, with N being the letter or letters of the alphabet representative of the number of PIM products measured by spectrum analyzer 70 in step 325. In the embodiment, processor 95 calculates the power ratio as dBc, decibels relative to the carrier. It is contemplated that a person having ordinary skill in the art can choose to calculate the power ratio using different units.

In step 340, processor 95 calculates the distance from pulsed tone PIM test system 20 to the location within device under test 80 of the source of each of the at least one PIM product measured in step 325. Processor 95 calculates the source distances using the elapsed time between T1 and $T2_{A-N}$ for each of the at least one PIM products, and the velocity factor value of device under test 80. Processor 95 stores the calculated distances in memory 96 as DAN, with N being the letter or letters of the alphabet representative of the number of PIM products measured by spectrum analyzer 70 in step 325.

In step 345, processor 95 retrieves at least one PIM product statistic for at least one PIM product A-N from memory 96 and displays the at least one statistic to user on display 85. In one embodiment, the PIM product statistics include at least one of PIM product power level, PIM product power ratio, or PIM product source distance.

In step 350, the program pauses for a predetermined length of time. In one embodiment, the predetermined length of time is about 0.5 seconds. However, it is contemplated that a person having ordinary skill in the art can choose to pause the program for a different predetermined length of time.

After pausing in step 350, processor 95 in step 355 examines the continuous sweep setting of pulsed tone PIM test system 20. The program returns to step 320 if system 20 is set to continuously sweep. In one embodiment, user can set pulsed tone PIM test system 20 to continuously sweep in step 315. Further, the user can cancel a previously set continuous sweep via keypad 90 while the program of FIG. 4 is being executed by processor 95. If the user did not set the continuous sweep option in step 315 or has canceled a previously set continuous sweep, processor 95 returns to step 310.

Figure 5:
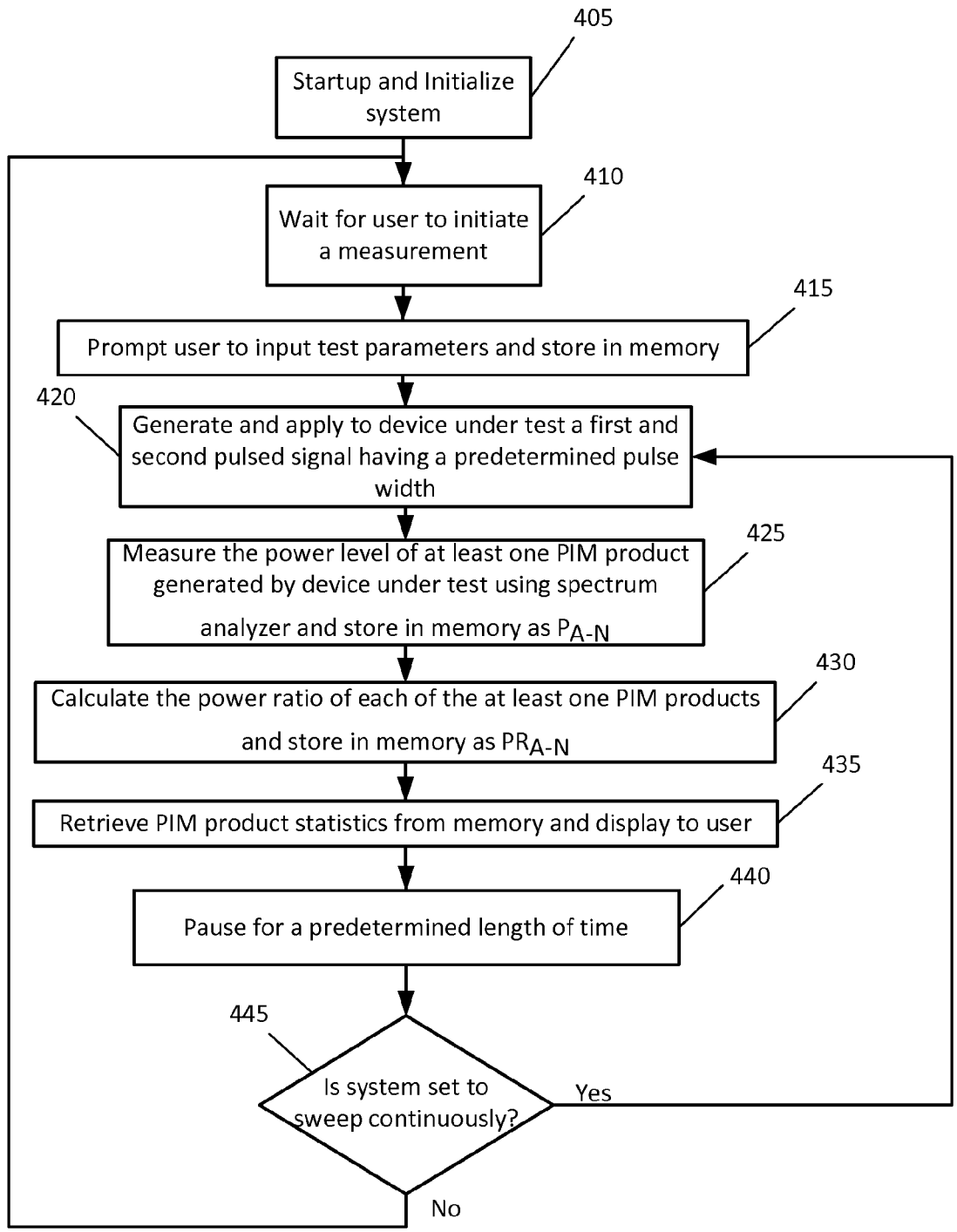
FIG. 5 is a flowchart of a program executed by the PIM test system processor that employs pulse stimulus in accordance with another embodiment of the invention.

FIG. 5 is a flowchart of the program stored in memory 96 and carried out by processor 95 in another embodiment of pulsed tone PIM test system 20. In step 405, pulsed tone PIM test system 20 is started and processor 95 is initialized. In step 410, the program waits for user to initiate a measurement before proceeding to step 415.

In step 415, the user is prompted to enter the testing parameters via keypad 90 and the testing parameters are stored in memory 96 upon entry. The testing parameters include one or more of those listed in conjunction with step 315 above.

In step 420, processor 95 uses first pulsed power amplifier 25, second pulsed power amplifier 30, and pulse generator 60 to generate and apply a first pulsed signal and a second pulsed signal in accordance with the testing parameters to device under test 80. The first pulsed signal and second pulsed signal are combined before they are applied to device under test 80. Pulse generator 60 activate first pulsed power amplifier 25 and second pulsed power amplifier 30 for a predetermined length of time, thereby generating a first pulsed signal and second pulsed signal having pulse width equivalent to the predetermined length of time. In one embodiment, the pulse width is about several milliseconds. In another embodiment, the pulse width is between about 1 millisecond and about 1 second.

In step 425, processor 95 uses spectrum analyzer 70 to measure the power level of at least one PIM product generated by device under test 80 and stores the measured power level of the at least one PIM product in memory 96 as $P_{A-N}$, with N being the letter or letters of the alphabet representative of the number of PIM products measured by spectrum analyzer 70 in this step.

In step 430, processor 95 calculates the power ratio of each of the at least one PIM products measured in step 425 and stores the measured power ratios as $PR_{A-N}$, with N being the letter or letters of the alphabet representative of the number of PIM products measured by spectrum analyzer 70 in step 325. In one embodiment, processor 95 calculates the power ratio in dBc, decibels relative to the carrier. It is contemplated that a person having ordinary skill in the art can choose to calculate the power ratio using different units.

In step 435, processor 95 retrieves at least one PIM product statistic for at least one PIM product A-N from memory 96 and displays the at least one statistic to user on display 85. In one embodiment, the PIM product statistics include at least one of PIM product power level and PIM product power ratio.

In step 440, the program pauses for a predetermined length of time. In one embodiment, the predetermined length of time is 0.5 seconds. However, it is contemplated that a person having ordinary skill in the art can choose to pause the program for a different predetermined length of time.

After pausing in step 440, processor 95 in step 445 examines the continuous sweep setting of pulsed tone PIM test system 20. The program returns to step 420 if system 20 is set to continuously sweep. In one embodiment, user can set pulsed tone PIM test system 20 to continuously sweep in step 415. Further, the user can cancel a previously set continuous sweep via keypad 90 while the program of FIG. 5 is being executed by processor 95. If the user did not set the continuous sweep option in step 415 or has canceled a previously set continuous sweep, processor 95 returns to step 410.

Figure 6A:
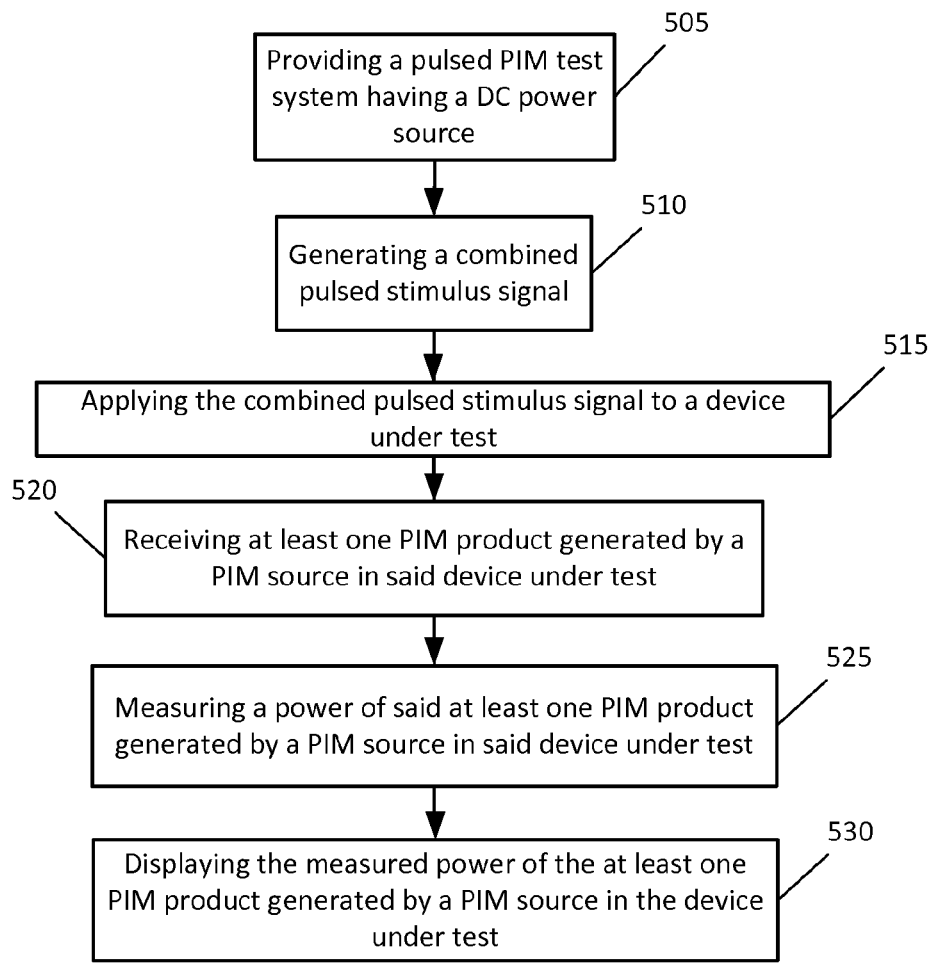
FIG. 6A is a flowchart of a method of using a PIM test system that employs pulse stimulus in accordance with an embodiment of the invention.

FIG. 6A shows one embodiment of a method of measuring PIM in a device under test 80. In step 505, a pulsed tone PIM test system 20 having a DC power source is provided. In step 510, said pulsed tone PIM test system 20 generates a combined pulsed stimulus signal. In step 515, the pulsed tone PIM test system 20 applies the combined pulsed stimulus signal to a device under test 80. In step 520, the pulsed tone PIM test system 20 receives at least one PIM product generated by a PIM source in the device under test 80.

In step 525, pulsed tone PIM test system 20 measures the power of the at least one PIM product received in step 520. In step 530, pulsed tone PIM test system 20 displays the value of the power measured in step 525 to a user. In some embodiments, if the user requests a frequency sweep, steps 510-530 are repeated for the frequency range of the frequency sweep.

Figure 6B:
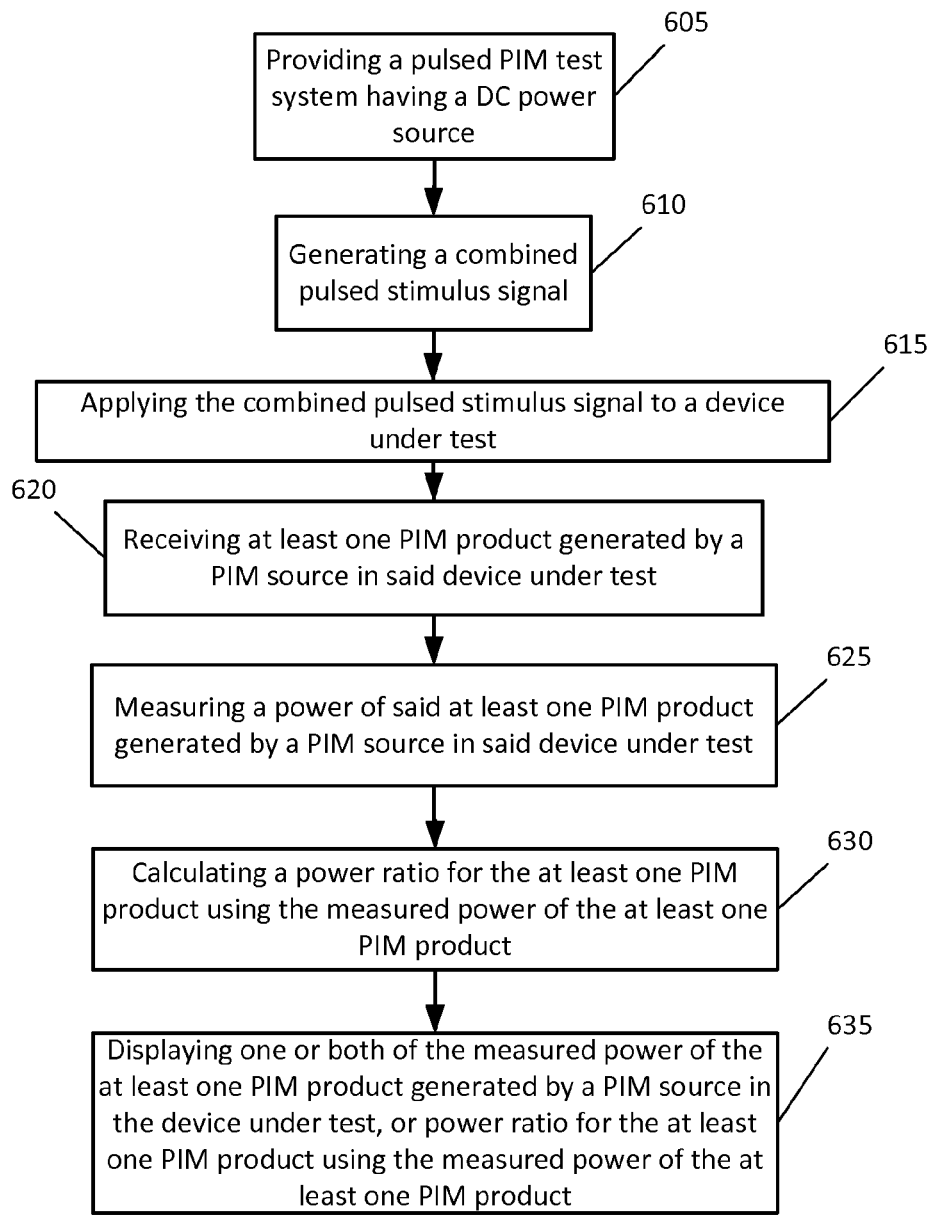
FIG. 6B is a flowchart of a method of using a PIM test system that employs pulse stimulus in accordance with another embodiment of the invention.

FIG. 6B shows another embodiment of a method of measuring PIM in a device under test 80. In step 605, a pulsed tone PIM test system 20 having a DC power source is provided. In step 610, said pulsed tone PIM test system 20 generates a combined pulsed stimulus signal. In step 615, the pulsed tone PIM test system 20 applies the combined pulsed stimulus signal to a device under test 80. In step 620, the pulsed tone PIM test system 20 receives at least one PIM product generated by a PIM source in the device under test 80.

In step 625, pulsed tone PIM test system 20 measures the power of the at least one PIM product received in step 620. In step 630, PIM test system 20 calculates a power ratio for at least one PIM product using the power measured in step 625. In step 635, pulsed tone PIM test system 20 displays the value of one or both of the measured power of the at least one PIM product generated by a PIM source in the device under test from step 625, or power ratio for the at least one PIM product from step 630. In some embodiments, if the user requests a frequency sweep, steps 610-635 are repeated for the frequency range of the frequency sweep.

Figure 6C:
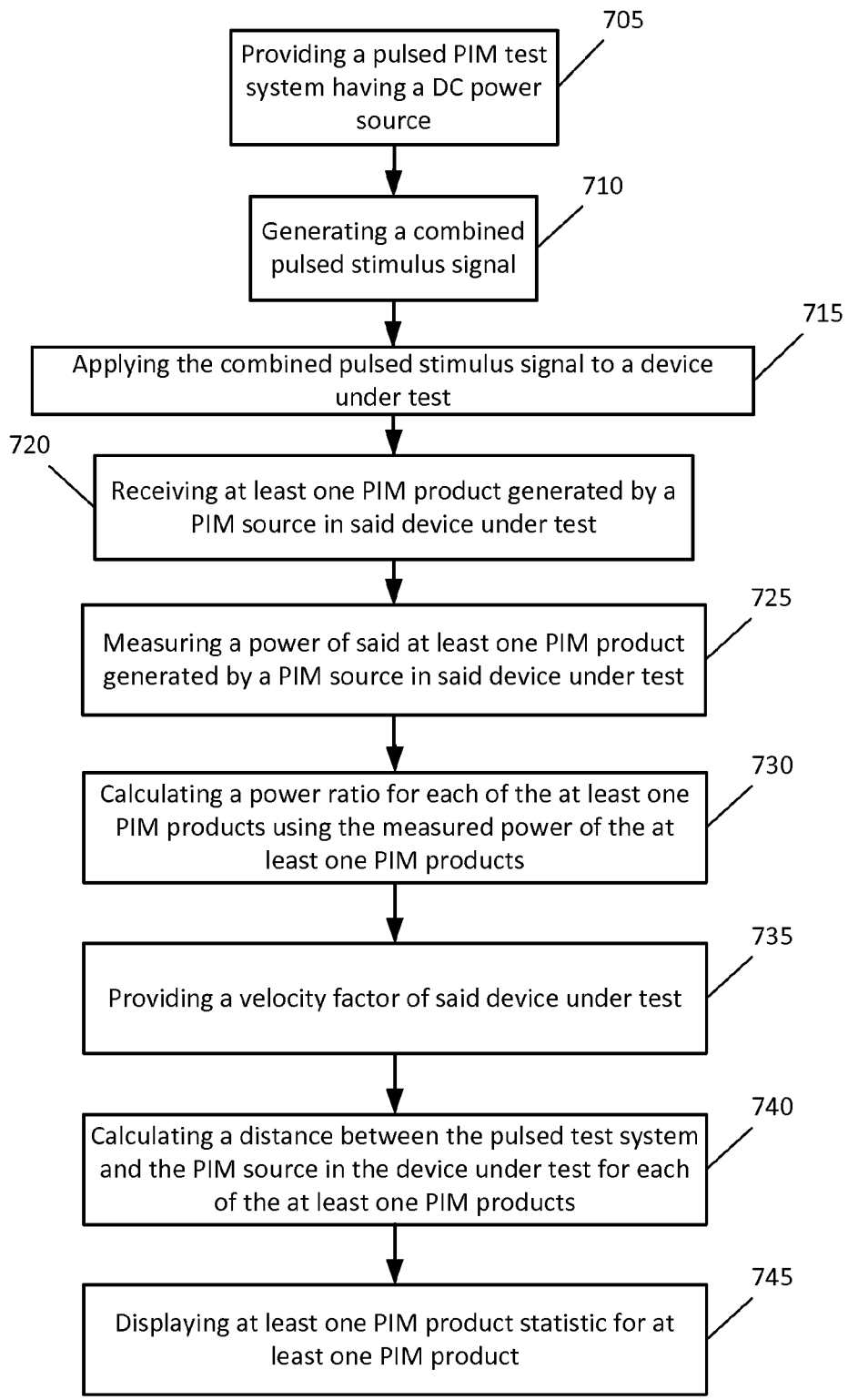
FIG. 6C is a flowchart of a method of using a PIM test system that employs pulse stimulus in accordance with a further embodiment of the invention.

FIG. 6C shows an additional embodiment of a method of measuring PIM in a device under test 80. In step 705, a pulsed tone PIM test system 20 having a DC power source is provided. In step 710, said pulsed tone PIM test system 20 generates a combined pulsed stimulus signal. In step 715, the pulsed tone PIM test system 20 applies the combined pulsed stimulus signal to a device under test 80 at time T1. In step 720, the pulsed tone PIM test system 20 receives at time $T2_{A-N}$ at least one PIM product generated by a PIM source in the device under test 80.

In step 725, pulsed tone PIM test system 20 measures the power of the at least one PIM product received in step 720. In step 730, PIM test system 20 calculates a power ratio for at least one PIM product using the power measured in step 725. In step 735 a velocity factor for the transmission medium of device under test 80 is provided to pulsed tone PIM test system 20. In step 740, pulsed tone PIM test system 20 uses the velocity factor provided in step 735 and the elapsed time between T1 and $T2_{A-N}$ to calculate the distance between pulsed tone PIM test system 20 and the PIM source in device under test 80. In step 745, pulsed tone PIM test system 20 displays at least one PIM product statistic for at least one PIM product. The at least one PIM product statistic in step 745 is at least one of PIM product power level, PIM product power ratio, or PIM product source distance. In some embodiments, if the user requests a frequency sweep, steps 710-745 are repeated for the frequency range of the frequency sweep.

Additional embodiments of the invention are described in Appendix A.

While this invention has been described in conjunction with the specific embodiments described above and in Appendix A, it is evident that many alternatives, combinations, modifications and variations are apparent to those skilled in the art. Accordingly, the preferred embodiments of this invention, as set forth above are intended to be illustrative only, and not in a limiting sense. Various changes can be made without departing from the spirit and scope of this invention. Combinations of the above embodiments and other embodiments will be apparent to those of skill in the art upon studying the above description and are intended to be embraced therein. Therefore, the scope of the present invention is defined by the appended claims, and all devices, processes, and methods that come within the meaning of the claims, either literally or by equivalence, are intended to be embraced therein.

What is claimed is:

1. A pulsed tone passive intermodulation (PIM) test system comprising:
    a DC power source configured to provide power to said pulsed tone PIM test system;
    a pulse generator electrically coupled to a first transmitter and a second transmitter, said pulse generator and said first transmitter configured for generating a first pulsed stimulus signal, said pulse generator and said second transmitter configured for generating a second pulsed stimulus signal;
    a first bandpass filter electrically coupled to said first transmitter configured to attenuate spectral components associated with said first pulsed stimulus signal;
    a second bandpass filter electrically coupled to said second transmitter configured to attenuate spectral components associated with said second pulsed stimulus signal;
    a combiner electrically coupled to said first and second bandpass filter, said combiner configured to combine said first and second stimulus signals into a combined pulsed stimulus signal;

a directional coupler having a main line with an input electrically coupled to said combiner and an output configured to be electrically coupled to a device under test, said main line configured to deliver said combined pulsed stimulus signal propagating in the forward direction to said device under test and receive a signal propagating in the reflected direction from said device under test; said directional coupler further comprised of a reflected channel output; said directional coupler further configured to sample said signal propagating in the reflected direction on said main line; said reflected channel output configured to provide said sample signal propagating in the reflected direction to a notch filter;

said notch filter electrically coupled to said reflected channel output and configured to attenuate said first and second pulsed stimulus signals from said sample signal propagating in the reflected direction;

a low noise gain stage electrically coupled to said notch filter, said low noise gain stage configured to amplify said sample signal propagating in the reflected direction; and a spectrum analyzer electrically coupled to said low noise gain stage configured to receive and identify at least one PIM product generated by a PIM source in said device under test.

2. The pulsed tone PIM test system of claim 1 further comprised of a processor electrically coupled to said pulse generator, first pulsed power amplifier, second pulsed power amplifier, and said spectrum analyzer, said processor configured to generate and apply said first and second stimulus pulses to said device under test at time T1 and measure a power of said at least one PIM products received by said spectrum analyzer at time $T2_{A-N}$;

said processor is configured to calculate a power ratio for said at least one PIM product, wherein said power ratio is dBc.

3. The pulsed tone PIM test system of claim 2, wherein said processor is further configured to calculate a distance between said pulsed tone PIM test system and said PIM source in said device under test using an elapsed time between T1 and $T2_{A-N}$ said at least one PIM product and a velocity factor value of said device under test.

4. The pulsed tone PIM test system of claim 3 further comprising a keypad electrically coupled to said processor, said keypad configured for user to enter said velocity factor value or select a transmission medium for said device under test that corresponds to a velocity factor value stored in memory of said processor; and a display electrically coupled to said processor, said display configured to display at least one PIM product statistic for said at least one PIM product.

5. The pulsed tone PIM test system of claim 4, wherein said at least one PIM product statistic is at least one of PIM product power level, PIM product power ratio, or PIM product source distance.

6. The pulsed tone PIM test system of claim 5, wherein said DC power source is comprised of a battery and circuitry configured to recharge said battery.

7. A pulsed tone passive intermodulation (PIM) test system comprising:

a DC power source configured to provide power to said pulsed tone PIM test system;

a pulsed signal generator electrically coupled to a combiner, said combiner configured to generate combined pulsed stimulus signal;

a directional coupler having a main line with an input electrically coupled to said combiner and an output configured to be electrically coupled to a device under test, said main line configured to deliver said combined pulsed stimulus signal propagating in the forward direction to said device under test and receive a signal propagating in the reflected direction from said device under test; said directional coupler further comprised of a reflected channel output; said directional coupler further configured to sample said signal propagating in the reflected direction on said main line; said reflected channel output configured to provide said sample signal propagating in the reflected direction to a receiver;

said receiver electrically coupled to said directional coupler; said receiver configured to receive and identify at least one PIM product generated by a PIM source in said device under test.

8. The pulsed tone PIM test system of claim 7 further comprised of a processor electrically coupled to said pulsed signal generator, and said receiver, said processor configured to generate and apply said combined pulsed stimulus signal to said device under test at time T1 and measure a power of said at least one PIM product received by said receiver at time $T2_{A-N}$.

9. The pulsed tone PIM test system of claim 8, wherein said combined pulsed stimulus signal is comprised of a first pulsed stimulus signal and a second pulsed stimulus signal;

said processor is configured to calculate a power ration for said at least one PIM product, wherein said power ratio is dBc.

10. The pulsed tone PIM test system of claim 9, wherein said processor is further configured to calculate a distance between said pulsed tone PIM test system and said PIM source in said device under test using an elapsed time between T1 and $T2_{A-N}$ said at least one PIM product and a velocity factor value of said device under test.

11. The pulsed tone PIM test system of claim 10 further comprising a user I/O electrically coupled to said processor, said user I/O configured for user to enter said velocity factor value or select a transmission medium for said device under test that corresponds to a velocity factor value stored in memory of said processor, wherein said user I/O is further configured to display at least one PIM product statistic for said at least one PIM product.

12. The pulsed tone PIM test system of claim 11, wherein said at least one PIM product statistic is at least one of PIM product power level, PIM product power ratio, or PIM product source distance.

13. The pulsed tone PIM test system of claim 12, wherein said DC power source is comprised of a battery and circuitry configured to recharge said battery; and said receiver uses at least one of a spectrum analyzer or a PIM analyzer to identify said at least one PIM product generated by said PIM source in said device under test.

14. A method for determining passive intermodulation (PIM) in a device under test, comprising the steps of:

providing a pulsed tone PIM test system having a DC power source;

generating a combined pulsed stimulus signal;

applying said combined pulsed stimulus signal to said device under test;

receiving at least one PIM product generated by a PIM source in said device under test; and measuring a power of said at least one PIM product generated by a PIM source in said device under test.

15. The method of claim 14, wherein said combined pulsed stimulus signal is comprised of a first pulsed stimulus signal and a second pulsed stimulus signal;

said method further comprises calculating a power ratio for said at least one PIM product using said measured power of said at least one PIM product, wherein said power ratio is dBc.

16. The method of claim 15, further comprising calculating a distance between said pulsed tone PIM test system and said PIM source in said device under test using an elapsed time between T1 and $T2_{A-N}$ for said at least one PIM product and a velocity factor of said device under test; wherein said combined pulsed stimulus signal is applied by said pulsed tone PIM test system to said device under test at time T1 and said at least one PIM product is received by a receiver of said pulsed tone PIM test system at time $T2_{A-N}$.

17. The method of claim 16, wherein velocity factor is provided by a user entering said velocity factor value into a user I/O of said pulsed tone PIM test system or using said user I/O to select said transmission medium for said device under test that corresponds to a velocity factor value stored in said pulsed tone PIM test system.

18. The method of claim 17, wherein said user I/O is further configured to display at least one PIM product statistic for said at least one PIM product.

19. The method of claim 18, wherein said at least one PIM product statistic is at least one of PIM product power level, PIM product power ratio, or PIM product source distance.

20. The method of claim 19, wherein said DC power source is comprised of a battery and circuitry configured to recharge said battery; and
    said receiver uses at least one of a spectrum analyzer or a PIM analyzer to identify said at least one PIM product generated by said PIM source in said device under test.

* * * * *